United States Patent
Freywald

(10) Patent No.: US 7,989,310 B2
(45) Date of Patent: Aug. 2, 2011

(54) FILLING OF INSULATION TRENCHES USING CMOS STANDARD PROCESSES FOR CREATING DIELECTRICALLY INSULATED AREAS ON A SOI DISK

(75) Inventor: Karlheinz Freywald, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 667 days.

(21) Appl. No.: 10/588,415

(22) PCT Filed: Feb. 5, 2005

(86) PCT No.: PCT/DE2005/000197
§ 371 (c)(1),
(2), (4) Date: Jul. 14, 2008

(87) PCT Pub. No.: WO2005/076344
PCT Pub. Date: Aug. 18, 2005

(65) Prior Publication Data
US 2008/0277755 A1    Nov. 13, 2008

(30) Foreign Application Priority Data
Feb. 6, 2004  (DE) .......................... 10 2004 005 804

(51) Int. Cl.
*H01L 21/76* (2006.01)

(52) U.S. Cl. ......... 438/435; 438/437; 438/426; 257/506
(58) Field of Classification Search .................. 438/435, 438/437, 426; 257/506, E23.002, E21.546
See application file for complete search history.

(56) References Cited

U.S. PATENT DOCUMENTS

| | | | |
|---|---|---|---|
| 5,126,817 A * | 6/1992 | Baba et al. ..................... | 257/347 |
| 5,759,913 A | 6/1998 | Fulford, Jr. et al. | |
| 5,872,058 A | 2/1999 | Van Cleemput et al. | |
| 5,933,746 A * | 8/1999 | Begley et al. .................. | 438/405 |
| 6,140,207 A | 10/2000 | Lee | |
| 6,180,490 B1 | 1/2001 | Vassiliev et al. | |
| 6,261,921 B1 | 7/2001 | Yen et al. | |
| 6,303,464 B1 * | 10/2001 | Gaw et al. ..................... | 438/422 |
| 6,791,155 B1 * | 9/2004 | Lo et al. ........................ | 257/506 |
| 6,828,646 B2 * | 12/2004 | Marty et al. .................. | 257/501 |
| 2001/0051423 A1 | 12/2001 | Kim et al. | |
| 2002/0076915 A1 | 6/2002 | Begley et al. | |
| 2003/0022522 A1 | 1/2003 | Nishiyama et al. | |
| 2003/0098493 A1 | 5/2003 | Marty et al. | |
| 2003/0234423 A1 | 12/2003 | Bul et al. | |

FOREIGN PATENT DOCUMENTS

| | | |
|---|---|---|
| JP | 01 222457 A | 9/1989 |
| WO | WO 02/103772 A2 | 12/2002 |

* cited by examiner

Primary Examiner — Thinh T Nguyen
(74) Attorney, Agent, or Firm — Stevens & Showalter LLP

(57) ABSTRACT

Insulating trenches isolate regions of a semiconductor layer and include hermetically sealed voids. After forming a trench, a first fill of $SiO_2$ is formed by a CVD process with the oxide layers having increasing thickness toward the upper trench edges forming first bottlenecks. The first fill oxide layers are then RIE etched to initially remove the oxide layer from the wafer surface with continued etching to remove the oxide layers in upper trench portions to define later sealing portions of the voids or to displace the first bottlenecks downward to define further bottlenecks. A second $SiO_2$ deposition is then performed using a low pressure CVD process to deposit oxide near steps formed previously and/or at the displaced bottlenecks to seal the voids. The deposition process is stopped when the sealed portions of the oxide layer above the voids are grown above the semiconductor wafer surface.

9 Claims, 2 Drawing Sheets

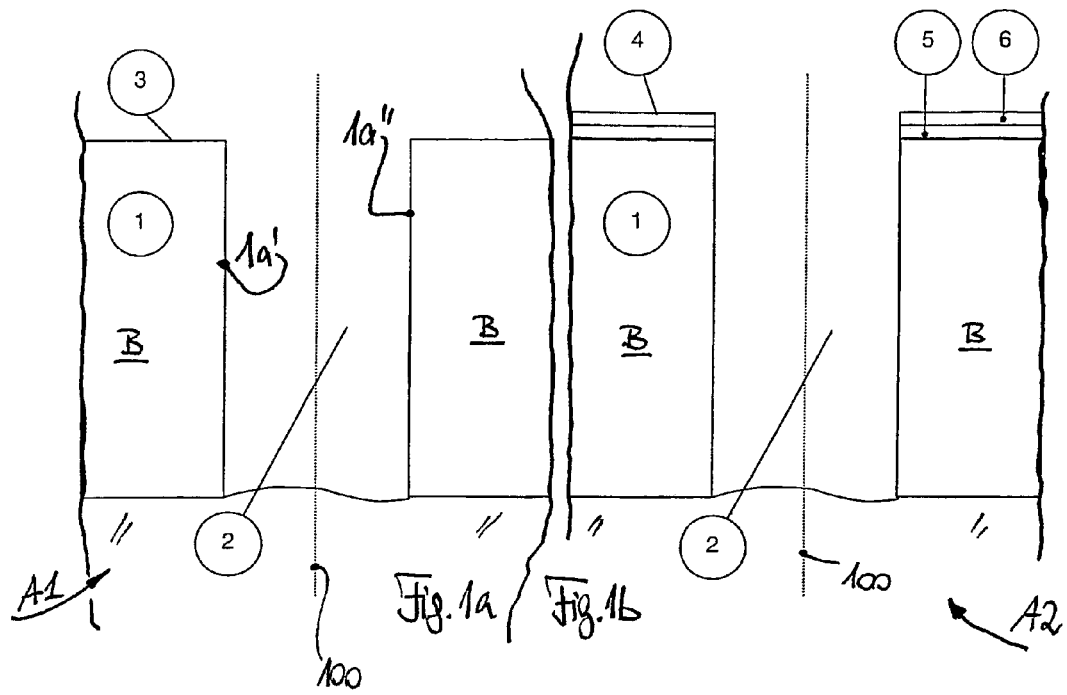
Fig. 2a  Fig. 2b
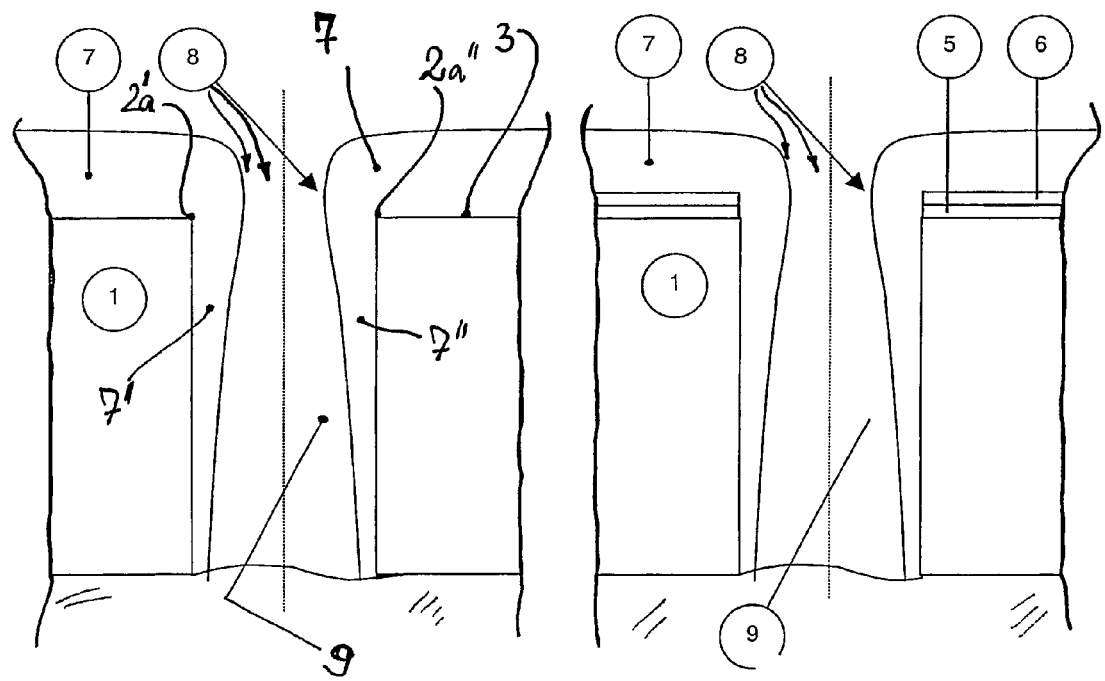

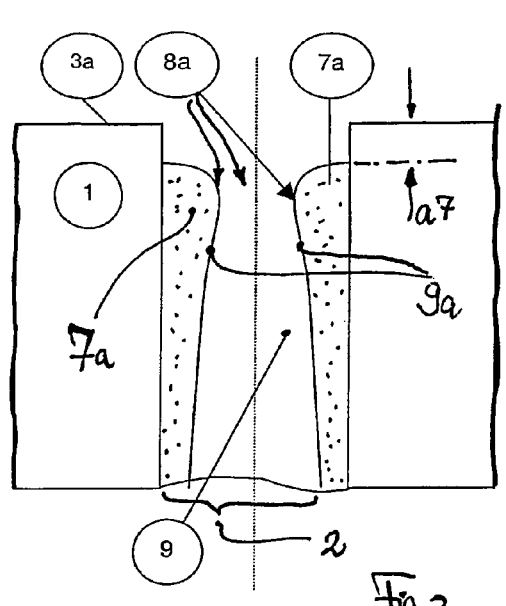
Fig. 3a
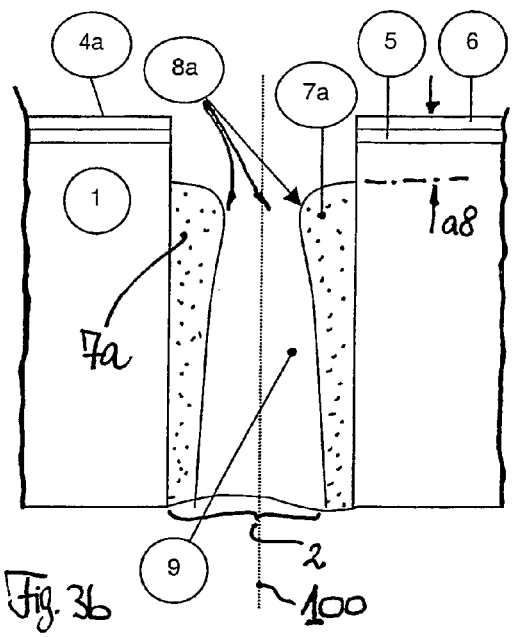
Fig. 3b
Fig. 4a
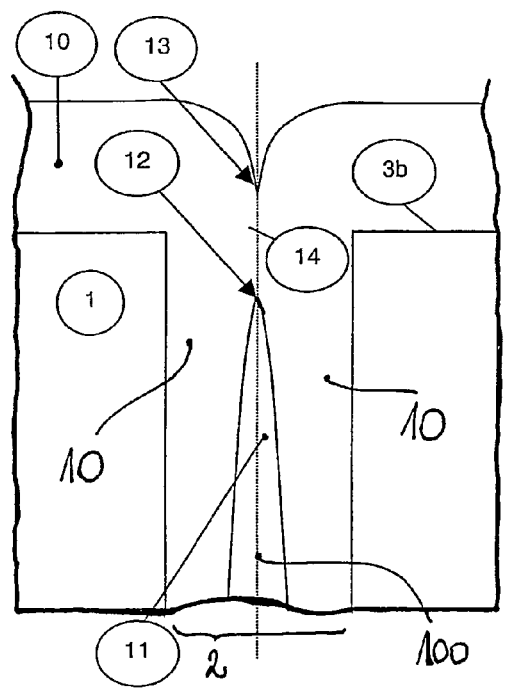
Fig. 4b
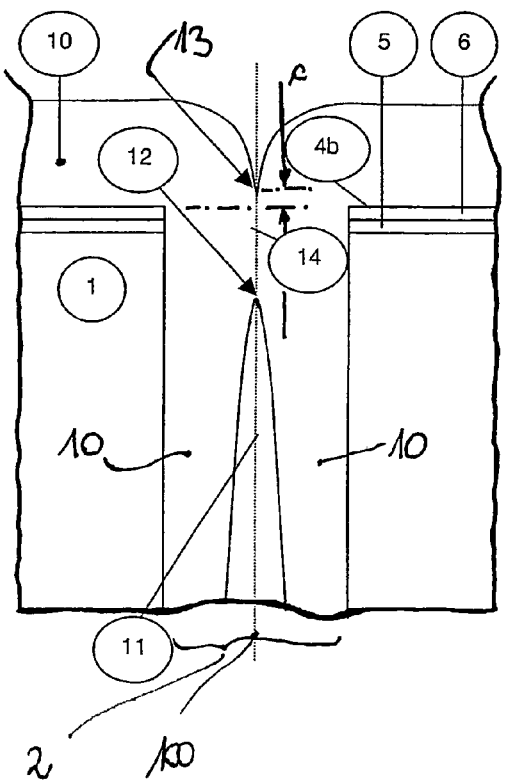

FILLING OF INSULATION TRENCHES USING CMOS STANDARD PROCESSES FOR CREATING DIELECTRICALLY INSULATED AREAS ON A SOI DISK

BACKGROUND OF THE INVENTION

1. Field of the Invention

The invention relates to a method of manufacturing filled isolation trenches in silicon by applying Complementary Metal Oxide Semiconductor (CMOS) standard processes for forming dielectrically insulated regions (insulation trenches; isolation trenches) on a Silicon on Insulator (SOI) wafer. To this end, only silicon dioxide ($SiO_2$) is to be used for the filling. The technique results in sealed cavities of voids within the trench. These remaining voids are advantageous with respect to a reduction of elastic stress. The technique leads to the filling of trenches having an aspect ratio ranging from small values to very high values with various angles of the sidewalls.

2. Description of Related Art

The conventional isolation trenches for the dielectric insulation of different circuit portions usually do not meet the requirements of micro electronic mechanic systems (MEMS) with respect to minimizing stress and using an equivalent fill material, which may, if required, be removed at defined positions in a later stage in a highly selective manner relative to silicon.

Most of the well-known techniques are based on the concept of avoiding voids. This is accomplished by either avoiding narrow portions or bottlenecks during the trench fill process (V-shaped trench profiles, specific deposition techniques) or by removing existing bottlenecks by a dedicated back etch process.

Avoiding voids may, for instance, be achieved by a V-shaped trench geometry including a specific edge design, cf. U.S. Pat. No. 6,180,490. Also in this case the aspect ratio of the trench to be filled is restricted.

In the known techniques for forming trench isolations of semiconductor devices in a semiconductor layer of an SOI wafer shallow trenches are used, which in most cases should be devoid of voids. U.S. Pat. No. 6,261,921 describes such a technique usable for shallow trenches, wherein a V-shaped trench is used and a silicon nitride layer is used for an additional edge retraction.

US-A 2002/0076915 describes a fill process with polysilicon deposited on an insulating layer. The method is used for SOI wafers for manufacturing integrated circuits, the method does, however, not allow high aspect ratios of the trench to be filled. As a special feature a tapering of the trench opening by back etching of overhanging material at the trench opening that builds up during the fill process is described in order to avoid voids.

A similar technique, however for trenches within the semiconductor (not an SOI wafer) with respect to shallow trenches having a depth of 1 μm or less is described in U.S. Pat. No. 6,140,207. Also in this case a tapering of the trench opening is realized by an oblique portion in the silicon.

U.S. Pat. No. 5,872,058 discloses a special deposition technique for a dielectric insulation layer ($SiO_2$ or any other material). This technique uses special deposition conditions, wherein the deposition rate and the etch rate are adjusted with different gas concentrations such that any bottlenecks in trench are avoided during the fill process, thereby enabling a substantially void-free filling of trenches. The aspect ratio is stated to be 3:1 or higher. Also in this case a filling of A-shaped trench structures does not appear to be possible.

BRIEF SUMMARY OF THE INVENTION

It is an object of the present invention to provide a cost effective realization of dielectrically insulated trenches (insulation trenches) in the context of the CMOS technique for as wide a spectrum of trench geometries as possible (various aspect ratios and different angles of the trench walls in the form of V-shaped and A-shaped configurations), wherein the trenches are to be sealed with respect to the wafer surface.

The invention is based on the object to provide a method that exclusively uses process steps of the CMOS standard technology for coating (filling) insulation trenches in a silicon wafer. The unavoidable occurring voids within the insulation trench are advantageous, since the voids may avoid stress.

The object is solved by the features as recited in claim 1. Also the product is claimed, independent of the manufacturing method, however also defined therethrough. The method is designed such that the closing point of the voids with respect to the wafer surface is positioned so deeply below the wafer surface that an opening of the voids in subsequent process steps may reliably be avoided.

BRIEF DESCRIPTION OF THE SEVERAL VIEWS OF THE DRAWINGS

The invention will be described and completed by embodiments including two semiconductor wafers by referring to the drawings.

FIG. 1a,

FIG. 1b represent an illustration of a trench 2 to be filled after a non-illustrated trench etch process into silicon 1 and after the removal of a resist or an oxide etch mask for the trench etch process of two different surfaces of semiconductor wafers A1, A2.

FIG. 2a,

FIG. 2b are illustrations of the partially filled trench 2, 9 after the first fill process using silicon dioxide. In all of the drawings a middle level 100 of the trenches 2 is shown.

FIG. 3a,

FIG. 3b are representations of the partially filled trench after the anisotropic etching of the silicon dioxide.

FIG. 4a,

FIG. 4b show the result after a second trench fill process with a hermitically tight seal 14.

DETAILED DESCRIPTION OF THE INVENTION

FIGS. 1a and 1b illustrate the trench 2 etched into the silicon 1 as an example of an (active) semiconductor layer after the removal of a resist etch mask or an oxide etch mask. That is, a silicon surface 3 or a poly silicon surface 4 are free of oxide. In FIG. 1b at least one oxide layer 5 is located under the layer 6 made of polysilicon, which is important during later process steps after the trench filling.

In FIG. 1 the devices and the portions of the two illustrated silicon wafers A1, A2 are shortly described. The silicon 1 is an active semiconductor layer, which in SOI wafers is positioned above a buried horizontal oxide and a carrier layer located below the buried oxide. The described trench 2 is formed in this active layer, wherein a length direction of the trench extends along the direction perpendicular to the drawing plane; the trench is to represent a variety of such trenches used for a dielectric insulation. These isolation trenches are also referred to as insulation trenches and serve for the "electrical isolation" of regions, which means that current may not flow through these insulating trenches in an amount that may interfere, preferably a current flow does not occur at all. These trenches form a dielectric barrier between different potentials and thus allow a potential generation of a voltage between the sidewall at the left-hand side of the trench 2, indicated as 1a', and the right-hand wall 1a". The trench depth is not explicitly illustrated. The trenches may be deep at aspect ratios of 15:1 and more. Only a portion is shown, to which relate the examples described herein in the area of the upper trench edge and an upper portion of these trenches, which is to referred to in this specification as an upper trench portion. Also not specifically shown are devices or structures that are generally denoted as B and are located in the active semiconductor layer 1 or which are formed therein in a later stage.

Such a silicon layer is to be understood to include all types of active semiconductor layers, irrespective of the specific material they are made of. These layers are to represent semiconductor layers, in this case a silicon in an SOI wafer, which acts as "silicon on insulator" as a generic term for the active semiconductor layer.

Upper trench edges of the trench 2 are shown in FIG. 2a. There, the left trench wall terminates at its upper edge 2a' and the right trench wall at the upper right trench edge 2a".

In FIGS. 2a and 2b there is schematically shown a silicon dioxide layer 7, which has been deposited on the surface and on the sidewalls 1a', 1a"; here sections 7', 7" are formed. In this case a narrow portion or bottleneck 8 above the silicon surface 3 is illustrated, which is inappropriately positioned for a further filling. The partially filled trench 9 (remaining trench) is not yet sealed and the still unfilled volume therein tapers downwardly.

FIGS. 3a and 3b schematically illustrate the result of an anisotropic etch process of the silicon dioxide 7, when performed with high selectivity with respect to the silicon 1. The anisotropic etch process preferably removes the silicon dioxide 7 in a direction perpendicular to the surface. Undercut portions 9a are etched with the lowest etch rate. Therefore the residues 7a of the filling will remain at the sidewalls 1a', 1a" as sketched and thus form a narrow portion or bottleneck 8a located below the silicon surface 3a and the polysilicon surface 4a, respectively. The bottleneck is offset in the downward direction with respect to the previous bottleneck 8. The respective measures a7, a8 demonstrate this effect in both methods.

In this way a step is created originating from the upper end of the remaining layers 7a and reaching to the surfaces 3a or 4a. This may be comparable to an "oxide recessing within the trench".

SiO$_2$ is again deposited, preferably by a low pressure technique and a sealing layer 10 is formed within and on the at least one trench 2, as illustrated in FIGS. 4a and 4b. The layer 10 extends across the remaining layers 7a, the steps at both sides and onto the horizontal surfaces outside the trench 2.

FIGS. 4a and 4b schematically show the result after completing the trench fill process on the basis of silicon dioxide 10. The sealing or closing point 12 is located (significantly) deeper compared to the silicon surface 3b and the polysilicon surface 4b, respectively. On the other hand the notch tip 13 in the filled area is located significantly higher compared to the silicon surface 3b and the polysilicon surface 4b, respectively, which may be of importance for a subsequent planarization. This illustrated in a symbolic manner by the distance "c". A planarization process may no longer reopen the sealed void 11. The distance c prevents such an unwanted opening, while also the recessing is helpful in this respect.

The remaining void or cavity 11 is hermetically sealed to the surface and does not contain any gas, since a low pressure process was used for the silicon dioxide deposition, in particular in the form of a low pressure CVD. The sealing portion 14 does not exhibit any further voids, since the trench geometry (trench width, recess depth of the sealing point 12) was selected in a defined manner.

The filling in the first fill step is adapted to or controlled with respect to "the trench geometry". The silicon dioxide deposition 7 providing the horizontal sections at both sides of the trench 2 and the vertical sections 7', 7" inside the trench 2 is adapted to the trench geometry, which has the upper corner areas and substantially vertical walls in the depth direction of the trench 2 as well as a substantially horizontal surface of the active semiconductor layer 1. Due to the trench geometry, the thickened portion of the deposited inner layer (inside the trench 2) is formed during the first deposition, wherein the left layer and the right layer in the vicinity of the trench edges 2a', 2a" (in the height area) grow more strongly or intensively, thereby increasingly forming a bottleneck 8, which has, as a bottleneck, a reduced width compared to the free volume 9 in the form of "remaining trench or residual trench", the width of which increases with increasing depth.

Since the bottleneck 8 is substantially independent of the trench depth, that is, the aspect ratio, and is substantially independent of the angle of the trench walls near the silicon surface, the position of a sealing point to be formed in a later stage is realized independently of the trench geometry. The controlled silicon dioxide deposition adapted to the trench geometry is meant as a deposition that is adapted to the illustrated trench geometry; the bottleneck 8 is automatically obtained, even and in particular with substantially vertical trench walls 1a', 1a". In this case the effect is taken advantage of that the silicon dioxide is deposited faster (at interfaces of faces parallel to the surface and faces having a vertical part, in the present case, the entire side faces facing inwardly or the inner surfaces of the trenches). The tapering of the entrance of the remaining void 9, that is, the largest bottleneck 8 of the trench 2, is obtained near the edges and is not avoided but instead is advantageously exploited.

The SOI wafer may be structured such that in its semiconductor layer located above the oxide layer, micro mechanic systems (MEMS) are also provided, which are not explicitly shown.

The second step of removing the SiO$_2$ layer, explained with reference to FIGS. 3a and 3b, shall be emphasized once again in order to explain the sealing or closing point 12, which is located in the respective embodiments below the respective surfaces 3b, 4b according to the respective FIGS. 4a and 4b.

The exemplary anisotropic reactive ion etching (RIE) etch process of the oxide layer 7 in FIGS. 2a and 2b results in two symbolical sub steps, thereby firstly removing the horizontal layer portions, as is shown in FIGS. 3a and 3b. This is the "first sub step" that is performed until the removal of the silicon dioxide layer on the wafer surface.

From then on the symbolic "second sub step" follows. Hereby, a portion of the silicon dioxide layer 7a provided at the vertical trench walls 1a', 1a" is also removed and the bottleneck 8 is displaced downwardly. In the upper trench portion, the oxide layer is thus removed down to a defined depth, as is shown as a7 in FIGS. 3a and a8 in FIG. 3b. Due to this material removal and the displacement of the bottleneck in the depth direction the later sealing point is determined, which is then actually formed by the further deposition of silicon dioxide of FIGS. 4a and 4b. The sealing point is located at the downwardly displaced bottleneck 8a, from which is obtained the upper sealing point 12, that is, the upper end of the sealed void 11, after the further deposition. This is simultaneously the lower end of the portion 14 of the hermetic sealing.

LIST OF REFERENCE SIGNS (the same reference signs refer to the same components throughout the figures)
- 1: silicon
- 2: trench etched into silicon
- 3: silicon surface after removal of the etch mask
- 3a: silicon surface after removal of the first fill oxide
- 3b: silicon surface covered by the second fill oxide
- 4: silicon surface after removal of the etch mask
- 4a: silicon surface after removal of the first fill oxide
- 4b: silicon surface covered by the second fill oxide
- 5 oxide layer
- 6 polysilicon layer
- 7 oxide layer after the first filling of the trench
- 7a: oxide layer after back etching the first fill oxide
- 8 narrowest portion, located higher relative to the level of the silicon surface
- 8a: narrowest portion after back etching the first fill oxide
- 9 partially filled trench during the technological process
- 10: oxide layer after the second filling of the trench
- 11: remaining void
- 12: sealing point located more deeply relative to the level of the silicon surface
- 13: tip of the notch of the second oxide filling
- 14: position of the hermitic seal

The invention claimed is:

1. A method of forming at least one dielectrically insulating isolation trench for dielectric isolation of regions of different potential of device structures formed above an SOI wafer including an active semiconductor layer, by forming at least one void in said at least one isolation trench, thereafter forming a hermetically tight seal of the at least one void with respect to the semiconductor wafer surface, the method comprising:
    performing a first fill in the form of a controlled deposition adapted to trench geometry with an aspect ratio of 15 to 1 or higher to thereby form oxide layers at trench walls, said oxide layers having an increasing thickness towards upper trench edges and forming a first bottleneck; subsequently anisotropically RIE etching the oxide layers in a first step until the oxide layers are removed from the wafer surface and subsequently continuing the RIE etching process in a second step for removing the oxide layers in an upper trench portion to a defined depth for defining a later sealing portion of the at least one void by displacing downwardly the first bottleneck to form a further bottleneck.

2. The method according to claim 1, further comprising a second oxide deposition performed by a low pressure CVD process, thereby again depositing an oxide near a step formed by the further bottleneck to seal the at least one void located therebelow, said second oxide deposition being stopped when the portion of the oxide layer above said at least one void is grown above a wafer level of the semiconductor layer.

3. The method according to claim 2, wherein after sealing said trench, the wafer surface is planarized and a technological process sequence is continued.

4. The method according to claim 1, wherein the RIE etching of the first trench filling in the area outside said trench stops on a polysilicon layer, which has previously been formed on at least one of a silicon dioxide layer and a multi insulator layer.

5. The method according to claim 2, wherein the same process technique is used during the first and the second depositions.

6. The method according to claim 2, wherein different process techniques are used during the first and the second depositions.

7. The method according to claim 1, wherein said SOI wafer comprises micro electronic mechanic systems (MEMS) in a semiconductor layer formed on the oxide layer.

8. The method according to claim 2, wherein the formed sealed of the at least one void is located below the level of the surface of the active semiconductor layer.

9. The method according to claim 1, wherein a surface of the sealed trench is planarized.

* * * * *